United States Patent [19]

Takeuchi

[11] Patent Number: 4,737,936
[45] Date of Patent: Apr. 12, 1988

[54] SEMICONDUCTOR MEMORY DEVICE HAVING IMPROVED WRITE-VERIFY OPERATION

[75] Inventor: Atsushi Takeuchi, Kawasaki, Japan

[73] Assignee: Fujitsu Limited, Kanagawa, Japan

[21] Appl. No.: 810,633

[22] Filed: Dec. 19, 1985

[30] Foreign Application Priority Data

Dec. 26, 1984 [JP] Japan .................. 59-273184

[51] Int. Cl.<sup>4</sup> .............................. G11C 7/00
[52] U.S. Cl. .................. 365/230; 365/185; 365/175; 307/449
[58] Field of Search .......... 365/185, 104, 230, 204, 365/189, 175; 307/449, 463

[56] References Cited

U.S. PATENT DOCUMENTS

| | | | |
|---|---|---|---|
| 4,301,535 | 11/1981 | McKenny et al. | 365/185 |
| 4,368,524 | 1/1983 | Nakamura et al. | 365/185 |
| 4,374,430 | 2/1983 | Higuchi | 365/104 |
| 4,601,017 | 7/1986 | Mochizuki et al. | 365/189 |

Primary Examiner—Stuart N. Hecker
Assistant Examiner—Glenn A. Gossage
Attorney, Agent, or Firm—Armstrong, Nikaido, Marmelstein & Kubovcik

[57] ABSTRACT

In a semiconductor memory device comprising row decoders, word line drivers, word lines, memory cells, a d.c. power source for a write mode, and a d.c. power source for a read mode, one of the word line drivers comprises a first circuit for supplying a write voltage from the d.c. power source for the write mode to one of the word lines selected by the row decoders when predetermined data is written into one of the memory cells connected to the selected word line and a second circuit for supplying a current from the selected word line to the d.c. power source for the read mode when the predetermined data is to be verified after the predetermined data has been written into one of the memory cells; the second circuit comprises a depletion type transistor and a one-directional conductive element connected in parallel to the depletion type transistor.

6 Claims, 4 Drawing Sheets

SEMICONDUCTOR MEMORY DEVICE HAVING IMPROVED WRITE-VERIFY OPERATION

BACKGROUND OF THE INVENTION (1.) Field of the Invention

The present invention relates to a semiconductor memory device. In particular, it relates to an improvement of a word line driver in the semiconductor memory device, which driver is arranged between row decoders and a memory cell array constituting an electrically programmable read only memory (EPROM), and supplies a signal having a predetermined level to a selected word line connected to the memory cell array in accordance with signals output from the row decoders when data is written into or read from a predetermined memory cell connected to the selected word line in the memory cell array constituting an EPROM.

(2.) Description of the Related Art

Generally, in an EPROM, the word line driver supplies a write voltage of, for example, d.c. 20 volts, from a d.c. power source for a write mode to a selected word line in accordance with signals output from the row decoders, when data is to be written into a predetermined memory cell connected to the selected word line. Thus, the above write voltage is supplied through the selected word line to a control gate of a cell transistor constituting a memory cell in an EPROM.

During this period (namely, in the write mode), the current flows from a writing circuit through the above cell transistor when predetermined data, for example, "0", is to be written into the predetermined memory cell, and electrons are gradually accumulated in a floating gate of the above cell transistor by supplying the write voltage to the control gate of the above cell transistor.

Therefore, in the cell transistor into which the predetermined data, for example, "0", has been written, the value of the threshold voltage of that cell transistor is increased. As a result, if data, for example, "0", has been written into the memory cell, the corresponding cell transistor does not conduct when the data is to be read from that cell transistor, even if the voltage for a read mode of, for example, d.c. 5 volts, is supplied through the selected word line to the control gate of that cell transistor.

Contrary to this, if the predetermined data, for example "1", is to be written into the predetermined memory cell, the above-mentioned electrons are not accumulated in the above-mentioned floating gate, and therefore, the value of the threshold voltage of the cell transistor is not changed. As a result, when the data, for example, "1", has been written into the memory cell, the corresponding cell transistor conducts by supplying the voltage level for a read mode through the selected word line to the control gate of the cell transistor, to output the read data from that memory cell.

Thus, the kind of data written into each memory cell, namely, "0" and "1", can be read from each memory cell through a sense amplifier by detecting whether or not the corresponding cell transistor is conductive in the read mode.

Further, in an EPROM, after the above-mentioned write process (programming) for each memory cell has been completed, a check is made to determine whether or not the correct data has been written into the corresponding memory cell. This check is generally known as a "Program Verify". Such a check is necessary because, if some of the memory cells are defective, it is possible that incorrect data has been written into those memory cells.

In this connection, when the program is verified, it is necessary to reduce the voltage level of the selected word line from the write mode level (for example, 20 (volts) to the read mode level (for example, 5 volts).

As an explanation of the above, if the voltage level in the write mode is maintained while the program is verified, the cell transistors into which the data "0" or "1" has been written conduct equally when the program is verified, and as a result, it is impossible to check whether the threshold voltage of the cell transistor, into which the predetermined data (for example, "0") has been written, has actually changed as mentioned above.

In the prior art, it is difficult to reduce the voltage level of the selected word line from the write mode level (for example, 20 volts) to the program verify mode level (for example, 5 volts) within a predetermined short time after the write process for each memory cell has been completed.

Therefore, in the prior art, a problem arises in that a predetermined long time after the write process for each memory cell has been completed is required to accurately verify the program written into each memory cell, and as a result, if the program written into each memory cell is verified within the predetermined short time after the write process for each memory cell has been completed, it is impossible to accurately verify the program written into each memory cell, and thus, some memory cells may be judged to be defective cells, even though these memory cells are actually good cells.

SUMMARY OF THE INVENTION

The present invention has been made in consideration of the above problem, and the object of the present invention is to exactly verify the program written into each memory cell within a predetermined short time after the write process for each memory cell is completed, without increasing the power consumed in the overall word line drivers, including the word line drivers connected to the non-selected word lines.

To attain the above object, according to the present invention, there is provided a semiconductor memory device comprising row decoders, word line drivers, word lines, memory cells, a d.c. power source means for a write mode, and a d.c. power source means for a read mode; one of the word line drivers comprising a first circuit for supplying a write voltage from the d.c. power source means for the write mode to one of the word lines selected by the row decoders when predetermined data is written into one of the memory cells connected to the selected word line, and a second circuit for supplying a current from the selected word line to the d.c. power source means for the read mode when the predetermined data is to be verified after the predetermined data has been written into one of the memory cells; the second circuit comprising a depletion type transistor and a one-directional conductive element connected in parallel to the depletion type transistor; and thereby, the one-directional conductive element conducts so that the predetermined data written into one of the memory cells can be verified immediately after the predetermined data has been written into one of the memory cells.

Thus, according to the present invention, when the voltage level of the selected word line is changed from the write mode level to the program verify mode level, both the depletion type transistor and the one-directional conducting element connected in parallel to the depletion type transistor conduct together, and thus, the electric charges charged in the selected word line during the write mode can be rapidly discharged through not only the above depletion type transistor but also through the above one-directional conducting element to the d.c. power source for the read mode.

Accordingly, it it possible to reduce the voltage level of the selected word line from the write mode level to the program verify mode level within the predetermined short time, and to accurately verify the program immediately after the write process for each memory cell is completed.

Further, as the one-directional conducting element conducts only when the voltage level of the selected word line is changed from the write mode level to the program verify mode level (i.e., the conducting element does not conduct in the read mode), it is possible to prevent an increase in the power consumed by the word line drivers in the read mode.

DESCRIPTION OF THE PREFERRED EMBODIMENTS

Figure 1A:
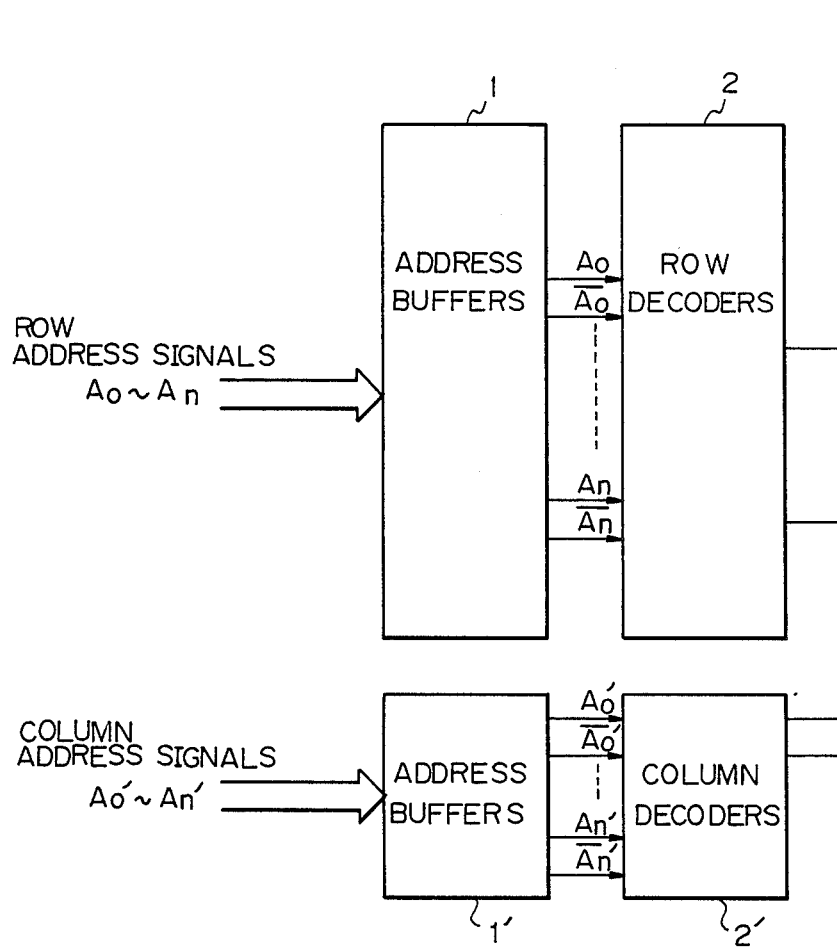
FIGS. 1A and 1B are is a circurt diagram illustrating the constitution of the semiconductor memory device including word line drivers and memory cell array constituting an EPROM in the prior art.
Figure 1B:
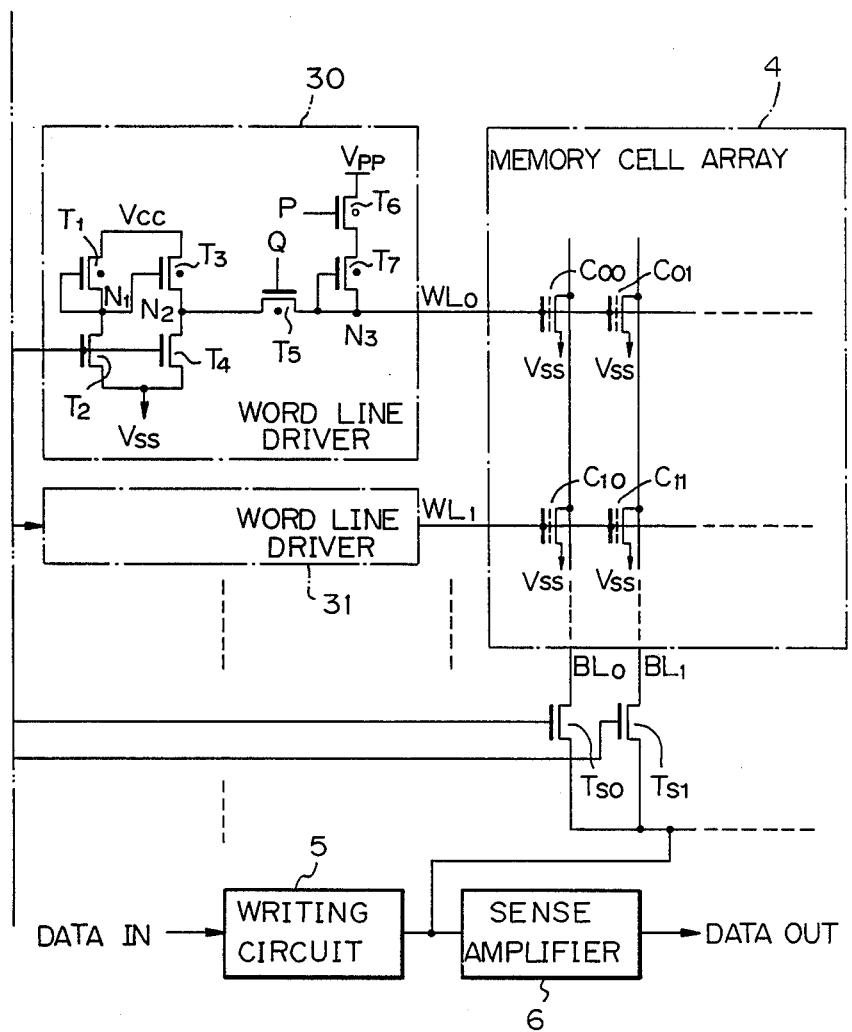

FIGS. 1A and 1B are a circuit diagram illustrating the constitution of the semiconductor memory device including the word line drivers and the memory cell array constituting an EPROM in the prior art, and an explanation concerning the above semiconductor memory device will be given in order to clarify the background of the present invention.

Referring to FIG. 1A, the row address signals $A_0$ to $A_n$ are input to address buffers 1, and each of the address buffers 1 outputs a pair of internal row address signals $A_0$, $\overline{A}_0$ (the inverted signal of the signal $A_0$) to $A_n$, $\overline{A}_n$ (the inverted signal of the signal $A_n$), respectively, and supplies these internal row address signals to row decoders 2. Similarly, column address signals $A'_0$ to $A'_n$ are input to address buffers 1', and each of the address buffers 1' outputs a pair of internal column address signals $A'_0$, $\overline{A}'_0$ to $A'_n$, $\overline{A}'_n$, respectively, and supplies these internal column address signals to column decoders 2'.

The row decoders 2 select a predetermined word line (for example, $WL_0$) and supply a selecting signal (for example, a low level signal) to a word line driver (FIG. 1B) connected to the selected word line $WL_0$, and supply a high level signal to the remaining word line drivers (for example, 31) connected to non-selected word lines (for example, $WL_1$), in accordance with the level of the internal row address signals $A_0$, $\overline{A}_0$ to $A_n$, $\overline{A}_n$. The selected word line $WL_0$ is connected to each control gate of cell transistors ($C_{00}$, $C_{01}$, ...) in a memory cell array 4. Similarly, the non-selected word line $WL_1$ is connected to each control gate of cell transistors ($C_{10}$, $C_{11}$, ...) in the memory cell array 4. Further, each of the remaining word lines is connected to the control gate of corresponding cell transistors in the memory cell array 4.

The column decoders 2' select a predetermined bit line (for example, $BL_0$) and supply a selecting signal (for example, a high level signal) to a gate of a transfer gate transistor $T_{S0}$ connected to the selected bit line $BL_0$, and supply a low level signal to the gates of the remaining transfer gate transistors (for example, $T_{S1}$) connected to non-selected bit lines (for example, $BL_1$) in accordance with the level of the internal column address signals.

When the selecting signal from the row decoders 2 is input to the word line driver 30 connected to the selected word line $WL_0$, for example, the word line driver 30 supplies a predetermined voltage level to the word line $WL_0$. In this connection, the voltage level supplied from the word line driver to the selected word line is set to a value of, for example, 20 volts, when data is to be written through a writing circuit 5 into a predetermined cell transistor (for example, $C_{00}$) in the memory cell array 4. Contrary to this, the voltage level is set to a value of, for example, 5 volts, when the data written into the predetermined cell transistor is to be read through a sense amplifier 6.

In the memory cell array 4, a predetermined number of cell transistors ($C_{00}$, $C_{01}$, $C_{10}$, $C_{11}$, ...) are arranged at the intersections formed by the word lines ($WL_0$, $WL_1$, ...) and the bit lines ($BL_0$, $BL_1$, ...). Each cell transistor constituting a memory cell in the EPROM (for example, $C_{00}$) has a floating gate (shown by a dotted line in FIG. 1B) in addition to the above-mentioned control gate.

In FIG. 1B, the constitution of the word line driver 30 adopted in the prior art is illustrated in detail.

As shown in FIG. 1B, N-channel type MOS transistors $T_1$ to $T_7$ are provided in the word line driver 30. Among these transistors, $T_1$, $T_3$, $T_5$, and $T_7$ are depletion type transistors (in the figures, a mark "." denotes the depletion type transistors), and a threshold voltage of 0 volt is set to the transistor $T_6$ (in the figures, a mark "o" denotes the transistors having a threshold voltage of 0 volt). Transistors $T_2$ and $T_4$ are enhancement type transistors.

When the data written into the predetermined memory cell in the EPROM is to be read from the predetermined memory cell, the word line driver connected to the selected word line operates to sharpen the rising of the selecting signal produced by inverting the output signal of the corresponding row decoder, and to supply this sharpened selecting signal having a predetermined level (i.e., the read mode level of, for example, 5 volts) to the selected word line. This operation is necessary to select the predetermined word line at a high speed and to read the data written into the predetermined memory cell at a high speed, even when the capacitance of the word line is large.

In FIG. 1B, it is assumed that when the word line $WL_0$ is selected, the output level of the corresponding row decoder supplied to the gates of transistors $T_2$ and $T_4$ in the word line driver 30 connected to the selected word line $WL_0$ becomes low. In this connection, when data is to be read from the predetermined memory cell, the voltage level Q supplied to the gate of transistor $T_5$ and the voltage level P supplied to the gate of transistor $T_6$ is set to a value of, for example, 5 volts, and a value of, for example, 0 volt, respectively. Accordingly, the transistor $T_5$ is turned ON, and the transistor $T_6$ is turned OFF.

Also, the above output level of the corresponding row decoder supplied to each gate of the transistors $T_2$ and $T_4$ is inverted by the inverter circuit constituted by the transistors $T_1$ and $T_2$. Therefore, the voltage level of the connection point $N_1$ between the transistors $T_1$ and $T_2$ becomes high when the corresponding word line $WL_0$ is selected. As a result, the depletion type transistor $T_3$ having the gate to which the above high voltage level is supplied is turned ON, and the voltage level of the connection point $N_2$ between transistors $T_3$ and $T_4$ then becomes high. Although, the voltage level of the connection point $N_1$ also has become high, only the predetermined constant current flows through the transistor $T_1$ having the source and gate connected in common. Contrary to this, although the size of transistor $T_3$ is generally designed to be small (i.e., the ratio of the channel width to the channel length of transistor $T_3$ is designed to be small), it is possible to make the current flowing from the power source for the read mode $V_{CC}$ to the selected word line $WL_0$ through transistors $T_3$ and $T_5$ larger compared with the constant current flowing through the transistor $T_1$, by supplying the high voltage level to the gate of the transistor $T_3$ connected to the connection point $N_1$. Thus, it is possible to charge up the stray capacitance associated with the corresponding word line $WL_0$ and to raise the voltage level of the word line $WL_0$ to the read mode level at a high speed, by sharpening the rise of the voltage level of the word line $WL_0$.

As mentioned above, the output level of the row decoders 2 supplied to the word line driver connected to the selected word line is low, and conversely, the output level of the row decoders 2 supplied to the word line drivers connected to the non-selected word lines is high. Therefore, in the word line drivers connected to the non-selected word lines, the current always flows from the power source for a read mode $V_{CC}$ (for example, 5 volts) to $V_{SS}$ (for example, 0 volt) through the transistors $T_3$ and $T_4$. Therefore, the power consumption resulting from the above current is relatively large, especially when the number of word line drivers connected to the word lines is large. Thus, it is desirable to design the size (the ratio of the channel width to the channel length) of the above depletion type transistor $T_3$ to be as small as possible, to lower the above-mentioned power consumption.

When the word line $WL_0$ is selected in order to write data into the predetermined memory cell, the voltage level P supplied to the gate of the transistor $T_6$ in the word line driver 30 is set to the $V_{PP}$ level (for example, 20 volts), and therefore, the write mode level supplied to the word line $WL_0$ becomes nearly equal to the differential value between the above $V_{PP}$ level and the threshold voltage of the transistor $T_6$, i.e., roughly 20 volts. Also, the voltage level Q supplied to the gate of the transistor $T_5$ is set to 0 volt. At this time, the source level of the transistor $T_5$ (the voltage level at the connection point $N_2$) becomes roughly equal to $V_{CC}$ when the word line $WL_0$ is selected (the output level of the corresponding row decoder supplied to the word line driver 30 becomes low), and thus, the transistor $T_5$ is turned OFF.

Contrary to this, in the word line drivers connected to the non-selected word lines, the output level of the row decoders supplied to the corresponding word line drivers becomes high and the source level of the transistor $T_5$ (the voltage level of the connection point $N_2$) becomes roughly equal to 0 volt (the transistor $T_4$ is turned ON), and thus, the depletion type transistor $T_5$ is turned ON. Namely, in the non-selected word line drivers, the current flows not only through the transistors $T_3$ and $T_4$, but also through the transistors $T_6$, $T_7$, and $T_5$, and thus, the voltage level of the non-selected word lines becomes roughly equal to 0 volt.

In this connection, as the gate and the source of the depletion type transistor $T_7$ are connected in common, the current flowing through the transistors $T_6$, $T_7$, and $T_5$ is limited and thus, the power consumption is lowered and the voltage level of the point $N_3$ connected to the non-selected word line reduced to about 0 volt.

As above-mentioned, when data is to be written into the predetermined memory cell (constituted by the cell transistor $C_{00}$, for example) connected to the selected word line (for example, $WL_0$), the write voltage of, for example, d.c. 20 volts, is supplied from the power source for the write mode $V_{PP}$ to the control gate of the cell transistor $C_{00}$ through the selected word line $WL_0$. During this period, namely, in the write mode, the current flows from the writing circuit 5 through the cell transistor $C_{00}$ when the predetermined data, for example "0", is to be written into the above cell transistor $C_{00}$, and thus, electrons are gradually accumulated in the floating gate of the cell transistor $C_{00}$ by supplying the above write voltage to the control gate of the cell transistor $C_{00}$.

Therefore, in the cell transistor $C_{00}$ into which the predetermined data, for example, "0", has been written, the value of the threshold voltage of the cell transistor $C_{00}$ is increased. As a result, if the data "0" has been written into the predetermined cell transistor (for example, $C_{00}$), the corresponding cell transistor does not conduct when the data is to be read from the cell transistor, even if the voltage level for the read mode $V_{CC}$ (for example, 5 volts) is supplied through the selected word line to the control gate of the predetermined cell transistor.

Contrary to this, if the data "1" has been written into the predetermined cell transistor, the corresponding cell transistor conducts by supplying the voltage level for the read mode through the selected word line to the control gate of the cell transistor, to output the read data from the predetermined cell transistor. Thus, as mentioned above, the kind of data written into each memory cell, namely, "0" and 1", can be read from each memory cell in the memory cell array 4 through the sense amplifier 6 by detecting whether or not the corresponding cell transistor is conductive in the read mode.

Further, in the EPROM, after the above-mentioned write process (programming) for each memory cell is completed, the check of whether or not the correct data has been written into each memory cell (namely, program verify) is carried out, and in this program verify mode, it is necessary to reduce the voltage level of the selected word line from the write mode level (for example, 20 volts) to the read mode level (for example, 5 volts), as mentioned above.

Thus, when the program is to be verified after the predetermined data has been written into the predetermined memory cell, the voltage level P supplied to the gate of the transistor $T_6$ is set to 0 volt, and the voltage level Q supplied to the gate of the transistor $T_5$ is set to the $V_{CC}$ level (for example, 5 volts). Namely, in the program verify mode, the voltage level supplied to each gate of the transistors $T_5$ and $T_6$ in the word line driver connected to the selected word line is usually set to the voltage level set when the data is read from the memory cell. Thus, when changing from the write mode to the program verify mode, the transistor $T_6$ is turned OFF, and the transistor $T_5$ is turned ON, and as a result, the electric charges charged in the corresponding word line during the write mode are discharged from the selected word line to the power source $V_{CC}$ through the transistors $T_5$ and $T_3$. Thus, the voltage level of the selected word line gradually falls from the $V_{PP}$ level (for example, 20 volts) to the $V_{CC}$ level (for example, 5 volts).

At this time, the gate level of the transistor $T_3$ (namely, the voltage level of the connection point $N_1$) is roughly equal to the source level of the transistor $T_3$ (namely, the $V_{CC}$ level). In this connection, when changing from the write mode to the program verify mode, the direction of the current flowing through the transistor $T_3$ is the reverse of that flowing through the transistor $T_3$ when the data is to be read from the memory cell. Thus, the source of the transistor $T_3$ is at the side of the connection point $N_2$ in the read mode, and at the side of the power source $V_{CC}$ in the program verify mode.

As a result, when changing from the write mode to the program verify mode, there is no voltage difference between the gate and the source of the transistor $T_3$. Also, as mentioned above, the size of the transistor $T_3$ (namely, the ratio of the channel width to the channel length of the transistor $T_3$) is designed to be small, to lower the power consumption generated in the word line drivers. Therefore, when changing from the write mode to the program verify mode, it is impossible to make the current flowing through the transistor $T_3$ as large as the current flowing through the transistor $T_3$ in the read mode.

Furthermore, at this time, the source level of the transistor $T_3$ is at the $V_{CC}$ level, and therefore, the voltage level of the substrate (0 volt) becomes negative compared with the source level. As a result, the value of the threshold voltage of the transistor $T_3$ is increased, due to the so-called "back-bias effect", and the characteristics of the transistor $T_3$ change to that of an enhancement type transistor, and thereby, the current flowing through the transistor $T_3$ is further decreased.

Therefore, in the prior art, it is difficult to reduce the voltage level of the selected word line from the write mode level to the program verify mode level within the predetermined short time after the write process for each memory cell has been completed. Particularly, when the programming is carried out in accordance with the high speed programming algorithm, the voltage level in the program verify mode is usually set to a voltage level higher than the usual voltage level in the read mode, and as a result, it becomes more difficult to reduce the voltage level of the selected word line from the write mode level to the program verify mode level, due to the above-mentioned back-bias effect.

The present invention has been made under the above-mentioned background, and the preferred embodiments of the present invention will be described below, with reference to FIG. 2, FIG. 3, and FIG. 4.

Figure 2:
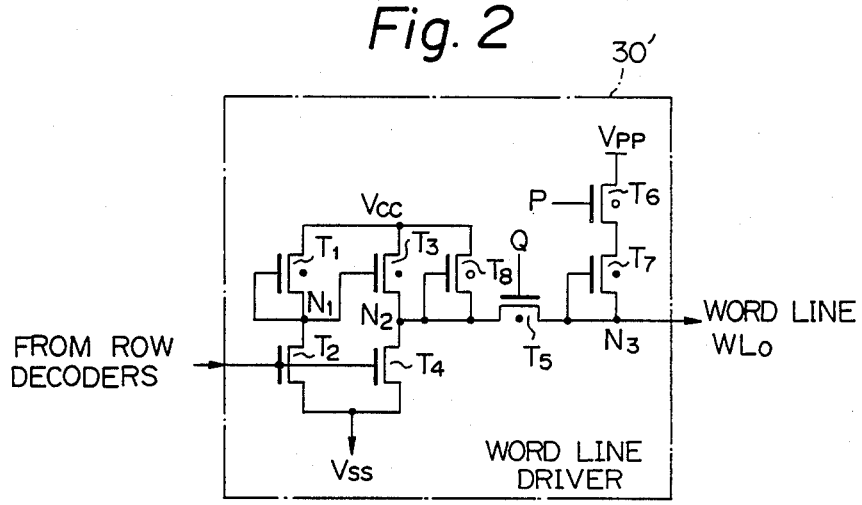
FIG. 2 is a circuit diagram illustrating the constitution of the word line driver in the semiconductor memory device according to one embodiment of the present invention.

FIG. 2 shows the constitution of the word line driver according to one embodiment of the present invention. The difference between the word line driver 30' according to the present invention shown in FIG. 2 and the word line driver (for example, 30) of the prior art shown in FIG. 1 is that in the word line driver 30' shown in FIG. 2, an N-channel type transistor $T_8$ having a threshold voltage of 0 volt is connected in parallel to the depletion type transistor $T_3$, namely, between the power source for the read mode $V_{CC}$ and the connection point $N_2$. The gate of the transistor $T_8$ is also connected to the connection point $N_2$.

When the program written into the predetermined memory cell connected to the predetermined word line (for example, $WL_0$) is to be verified, the gate level P of the transistor $T_6$ and the gate level Q of the transistor $T_5$ in the word line driver 30' are set to 0 volt and the $V_{CC}$ level (for example, 5 volts), respectively, and thereby, the transistor $T_6$ is turned OFF and the transistor $T_5$ is turned ON. Thus, the electric charges charged in the corresponding word line $WL_0$ during the write mode are discharged through the transistor $T_5$ and the parallel-connected transistors $T_3$ and $T_8$, to the d.c. power source $V_{CC}$.

In this connection, as mentioned above, the size of the depletion type transistor $T_3$ is designed to be small, to lower the power consumption in the overall word line drivers including the word line drivers connected to the non-selected word lines. Also, at this time, there is no voltage difference between the gate and the source of the transistor $T_3$, and the above-mentioned back-bias effect is increased. Thus, it is impossible to make the value of the current flowing through the transistor $T_3$ large, when changing from the write mode to the program verify mode.

However, according to the present invention, the large current resulting from the above-mentioned discharge can be made to flow from the selected word line $WL_0$ to the power source $V_{CC}$ by connecting the transistor $T_8$ in parallel to the above depletion type transistor $T_3$. At this time, the source and the drain of the transistor $T_8$ are at the side of the power source $V_{CC}$ and at the side of the connection point $N_2$, respectively. Thus, it is possible to reduce the voltage level of the word line $WL_0$ to the $V_{CC}$ level within the predetermined short time after the write process for each memory cell has been completed and to accurately verify the program, even if the above depletion type transistor $T_3$ is designed to be small in size.

Further, while the data is read from the predetermined memory cell, i.e., when the current flows from the power source $V_{CC}$ to the selected word line $WL_0$ through the transistors $T_3$ and $T_5$, and the current flows from the power source $V_{CC}$ to $V_{SS}$ through the transistors $T_3$ and $T_4$ in the word line drivers connected to the non-selected word lines, there is no voltage difference between the gate and source of the transistor $T_8$ (at this time, the source of the transistor $T_8$ shifts to the side of the connection point $N_2$), and thus, the transistor $T_8$ does not conduct.

Namely, the transistor $T_8$ conducts only when the voltage level of the selected word line changes from the write mode level to the program verify mode level, and thus, the increase of power consumption generated in the read mode resulting from the addition of the transistor $T_8$ does not occur. Therefore, it is not necessary to design the transistor $T_8$ to be small in size, and thus, the large discharge current can be made to flow through the transistor $T_8$ from the selected word line $WL_0$ to the power source $V_{CC}$ when changing from the write mode to the program verify mode.

Although, in the above embodiment, the threshold voltage of the transistor $T_8$ is set to 0 volt, it is also possible to prevent the transistor $T_8$ from conducting in the read mode even if the threshold voltage of the transistor $T_8$ is set to be larger than 0 volt. Therefore, the enhancement type transistor $T_8$ having a threshold voltage larger than 0 volt may be used as the transistor $T_8$ in accordance with the value of the current flowing when changing from the write mode to the program verify mode.

Figure 3:
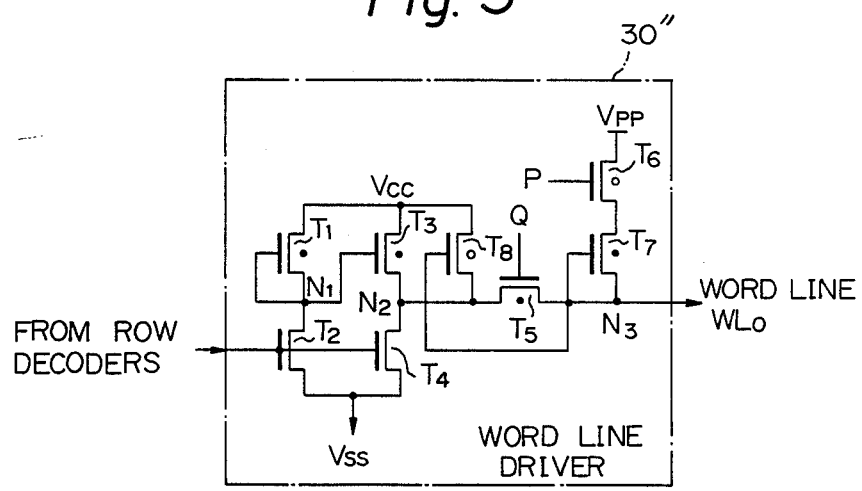
FIG. 3 is a circuit diagram illustrating the constitution of the word line driver according to another embodiment of the present invention.
Figure 4:
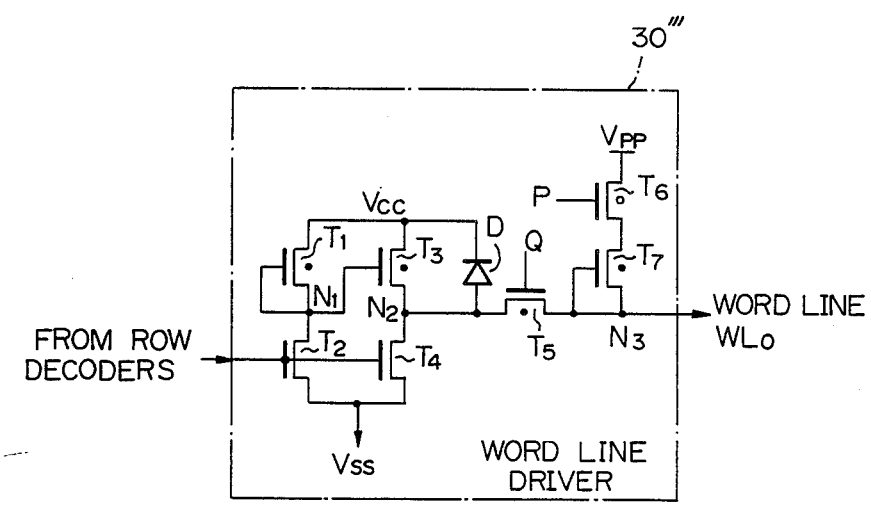
FIG. 4 is a circuit diagram illustrating the constitution of the word line driver according to still another embodiment of the present invention.

FIG. 3 shows the constitution of the word line driver 30" according to another embodiment of the present invention. In FIG. 3, the gate of the transistor $T_8$ is connected to the point $N_3$, i.e., to the corresponding word line $WL_0$. The operation of the transistor $T_8$, however, is the same as that shown in FIG. 2, and a description thereof is therefore omitted. FIG. 4 shows the constitution of the word line driver 30''', according to still another embodiment of the present invention. In FIG. 4, a diode D is connected in parallel to the depletion type transistor $T_3$ instead of the above-mentioned transistor $T_8$. The diode D also conducts only when the voltage level of the selected word line changes from the write mode level to the program verify mode level.

As described above, according to the present invention, it is possible to accurately verify the program written into each memory cell within the predetermined short time after the write process for each memory cell has been completed, without increasing the power consumed, especially in the read mode, in the overall word line drivers including the word line drivers connected to the non-selected word lines.

What is claimed is:

1. A semiconductor memory device comprising:
   row decoders;
   word line drivers;
   word lines;
   memory cells;
   a d.c. power source means for a write mode; and
   a d.c. power source means for a read mode;
   one of said word line drivers including
      a first circuit that supplies a write voltage from said d.c. power source means for the write mode to one of said word lines selected by said row decoders when predetermined data is written into one of said memory cells connected to said selected word line, said first circuit being connected to a node as a connecting point of a depletion type transistor and a drive transistor in an input stage of the word line driver; and
      a second circuit that supplies a current from said selected word line to said d.c. power source means for the read mode when said predetermined data is to be verified after said predetermined data has been written into one of said memory cells;
   said second circuit including
      said depletion type transistor and a one-directional conductive element connected in parallel to said depletion type transistor, and
      said drive transistor connected to said node, said depletion type transistor and said one-directional conductive element being connected in parallel between said d.c. power source means for the read mode and said node as a connecting point of said depletion type transistor and said drive transistor in the input stage of the word line driver;
   wherein said one-directional conductive element conducts so that the predetermined data written into one of said memory cells can be verified immediately after said predetermined data has been written into one of said memory cells.

2. A semiconductor memory device according to claim 1, wherein said depletion type transistor has a gate to which is supplied a voltage level from the output signal of the corresponding row decoder.

3. A semiconductor memory device according to claim 1, wherein said one-directional conductive element is a transistor having a threshold voltage equal to or larger than 0 volt.

4. A semiconductor memory device according to claim 1, wherein said one-directional conductive element is a transistor having a threshold voltage equal to or larger than 0 volt, and having a gate and a drain connected together in a program verify mode.

5. A semiconductor memory device according to claim 1, wherein said one-directional conductive element is a transistor having a threshold voltage equal to or larger than 0 volt, and having a gate connected to the corresponding word line.

6. A semiconductor memory device according to claim 1, wherein said one-directional conductive element is a diode connected in parallel to said depletion type transistor.

* * * * *